United States Patent [19]
Kurosawa et al.

[11] Patent Number: 5,866,212
[45] Date of Patent: Feb. 2, 1999

[54] METHOD OF PRODUCING MAGNETORESISTIVE SENSOR

[75] Inventors: Hisao Kurosawa, Fukaya; Chiharu Mitsumata, Tano-gun; Toshio Kobayashi, Fujioka; Shin Noguchi, Kumagaya, all of Japan

[73] Assignee: Hitachi Metals, Ltd., Tokyo, Japan

[21] Appl. No.: 26,528

[22] Filed: Feb. 20, 1998

Related U.S. Application Data

[62] Division of Ser. No. 744,661, Nov. 6, 1996.

[30] Foreign Application Priority Data

Jun. 11, 1995 [JP] Japan .................. 7-311604

[51] Int. Cl.$^6$ ........................ B01J 19/08
[52] U.S. Cl. .............. 427/457; 216/79; 427/129; 427/130; 427/131; 427/307; 427/331
[58] Field of Search ........... 427/457, 129, 427/130, 131, 307, 331; 216/79

[56] References Cited

U.S. PATENT DOCUMENTS

| | | | |
|---|---|---|---|
| 5,315,468 | 5/1994 | Lin et al. | 360/113 |
| 5,380,548 | 1/1995 | Lin et al. | 427/130 |
| 5,436,778 | 7/1995 | Lin et al. | 360/113 |

OTHER PUBLICATIONS

IEEE Trans. Mag., *Unidirectional Anistropy in Nickel–Iron Films by Exchange Coupling with Antiferromagnetic Films*, R.D. Hempstead et al., 1978, 521–523 (No Month Avail.).

Appl. Phys. Lett, 65 (9), *Improved Exchange Coupling Between Ferromagnetic Ni–Fe and Antiferromagnetic Ni–Mn–Based Films*, T. Lin et al., Aug. 29, 1994, 1183–1185.

J. Phys. Chem. Solids Pergamon Press, *The Antiferromagnetic Structure of NiMn*, J.S. Kasper et al., May 7, 1959, 231–238.

*Primary Examiner*—Bernard Pianalto

[57] ABSTRACT

A magnetoresistive (MR) sensor for MR heads comprising a magnetoresistive ferromagnetic layer (MR layer) and an antiferromagnetic layer in direct contact with the surface of the MR layer. The MR layer has a face-centered-cubic (fcc) structure. The crystalline structure of the antiferromagnetic layer is the fcc structure in the vicinity of the interface of the MR layer and the antiferromagnetic layer, and continuously changes to a face-centered-tetragonal (fct) structure toward the surface opposite to the interface. The interface of the MR layer and the antiferromagnetic layer is continuous with respect to the crystalline structure due to the epitaxial growth of the antiferromagnetic layer on the surface of the MR layer.

2 Claims, 9 Drawing Sheets

40 nm

BEFORE HEAT TREATMENT    10 nm

AFTER HEAT TREATMENT (290°C X 6 hr)  
10 nm

NO SiO₂ LAYER  
10 nm

METHOD OF PRODUCING MAGNETORESISTIVE SENSOR

CROSS-REFERENCE TO RELATED APPLICATIONS

This is a divisional of application Ser. No. 08/744,661, filed Nov. 6, 1996.

BACKGROUND OF THE INVENTION

The present invention relates to a magnetoresistive head (MR head) used in a magnetic disk unit, etc., and more specifically, relates to a magnetoresistive sensor (MR sensor) for MR head, in which Barkhausen noise is effectively suppressed by exchange coupling of a magnetoresistive ferromagnetic layer (MR layer) with an antiferromagnetic layer, and a production method of the MR sensor.

Recently, the magnetic recording technique has made great progress. For example, it has been demanded to reduce the size and weight of a domestic VTR or VCR, and to reduce the size and highly increase the capacity of a magnetic disk unit. To meet the demand, a high recording density technique has now become being extensively studied. As the magnetic head for high density recording, an MR head having a magnetoresistive element as the sensing element is now putting into practical use.

The magnetic heads for high density recording brought into practice includes a ring magnetic head utilizing a ferrite single crystal in which the reading and writing are operated by a single head, a metal-in-gap magnetic head in which a magnetic layer of high saturation flux density is provided in a magnetic gap, an inductive thin film head made by utilizing photolithographic technique, and an MR reading/inductive writing head which consists of an inductive thin film head for writing and an MR head for reading. The study is being concentrated to the MR reading/inductive writing head because of its suitability for high density recording.

It would be effective for reducing the size of a magnetic disk unit to decrease the outer diameter of a magnetic recording medium such as a magnetic disk. However, this reduces the relative speed between the magnetic disk and the magnetic head, and as a result thereof, a sufficient output level becomes difficult to be obtained in the conventional electromagnetic inductive head such as a ring ferrite magnetic head and an inductive thin film magnetic head. On the other hand, since the MR head detects at least one of the amount and the direction of the signal field, the output level is constant without depending on the relative speed between the magnetic head and the magnetic disk. For this reason, the development of a highly efficient MR head is indispensable to meet the recently increasing demand for reducing the size of a magnetic disk unit.

FIG. 12 is a schematic illustration of a typical MR reading/inductive writing magnetic head. This illustration is a perspective view, from the side at which the magnetic recording medium is positioned, of the left half of the head taken along the center line thereof. An magnetoresistive element (MR element) 2 is disposed in a space between a bottom shield 1 on a substrate 20 and a middle shield 5 via two insulating layers (not shown), each in contact with the respective bottom shield 1 and middle shield 5, to form an MR reading head. On the upper side of the MR reading head, is mounted an inductive thin film writing head comprising a closed magnetic circuit constituted of a top writing magnetic pole 7 and the middle shield 5 and a writing coil 6. Both the heads are magnetically isolated from each other by the middle shield 5 so as to avoid the magnetic interference therebetween.

FIG. 13 is a schematic view of the side, opposite to a magnetic recording medium, of an MR sensor of a typical MR head. The MR element 2 has a multi-layered structure comprising a ferromagnetic MR layer 3 made of a magnetoresistive material such as NiFe-based alloy, etc., a space layer 9 made of a non-magnetic material having a relatively high electrical resistance such as Ta, a soft adjacent layer (SAL) 8 made of a soft magnetic material such as NiFeNb, NiFeCr, etc., and an antiferromagnetic layer 30, which is in direct contact with the MR layer 3, made of an NiMn-based alloy, etc. The SAL layer 8 provides the MR layer 3 with a transverse bias filed to maintain the reading operation linear. The antiferromagnetic layer 30 creates an antiferromagnetic exchange coupling with the MR layer 3 to suppress Barkhausen noise. An electrode layer 32 is connected to the antiferromagnetic layer 30. When a signal field as the external field is applied to the MR element, the electrical resistance of the MR layer 3 is reduced. As a result thereof, the voltage drop of the constant current from the electrode layer 32 becomes smaller and the change in the voltage drop is detected as the electrical signal corresponding to the signal field. The reference numerals 12, 21 and 23 show insulating layers and the reference numeral 18 shows a writing gap.

The problem usually encountered with the use of the MR head is reduction in SIN ratio due to Barkhausen noise. The sensor of the MR head which detects magnetic field has a film of a magnetoresistive ferromagnetic material, usually Permalloy (NiFe). A magnetic substance such as NiFe film, etc. is in a closure multi-domain state so as to minimize the magnetic energy. When a signal filed is applied thereto from a magnetic recording medium, the magnetic domain begins to rotate to cause the wall motion. When the wall motion is inhibited by the impurities or defects in the NiFe film, the magnetoresistive response curve becomes discontinuous and shows hysteresis. As a result, the wave form of output is distorted to cause noise. Thus, Barkhausen noise occurs.

To suppress Barkhausen noise, it is effective to induce a strong magnetic anisotropy in the lengthwise direction of the MR layer, thereby creating a single domain state in the MR layer. Hempstead et al. in IEEE Trans. Magn., MAG-14, 521 (1978) teach a method of aligning the spins in the NiFe film to the direction of the spins in the FeMn film. In this method, the spins of the NiFe ferromagnetic film are magnetically coupled with the spins of an antiferromagnetic γ-FeMn film sputtered on the NiFe film by utilizing an interface exchange interaction. However, since the FeMn film is susceptible to corrosion and the blocking temperature (TB) at which the exchange coupling field (Hua) of the NiFe/FeMn films goes to zero is relatively low, i.e., 150° C. or lower, the operating conditions and environments for the MR head must be strictly controlled.

Tsann Lin et al. in Appl. Phys. Lett., 65, (9), 1183 (1994) teach the use of an NiMn film in place of the FeMn film. It is taught therein that the $T_B$ is 400° C. or higher, the Hua is 100 Oe or higher, and the corrosion resistance is superior to the FeMn film. Although the Hua of the as deposited NiFe/FeMn films is 20–30 Oe, the Hua of the as deposited NiFe/NiMn films is only several Oe, namely, the NiMn layer creates a very weak exchange coupling with the NiFe layer as compared with the FeMn layer. It is further reported that the heat treatment at a temperature higher than 240°–250° C. for at least several hours is required for increasing the Hua of the NiFe/NiMn films.

However, the inventors have found that the Hua of the NiFe/NiMn layers sufficiently increases in a certain case, but, not so increases in another case even when subjected to a sufficient heat treatment.

OBJECT AND SUMMARY OF THE INVENTION

Accordingly, an object of the present invention is to provide an MR sensor for use in MR head having an increased and stable Hua of the NiFe/NiMn layers to effectively suppress Barkhausen noise and a production method thereof.

In accordance with the present invention, the MR sensor for MR heads comprises a magnetoresistive ferromagnetic layer (MR layer) and an antiferromagnetic layer provided in direct contact with the surface of the MR layer. The MR layer has a face-centered-cubic (fcc) structure. The crystalline structure of the antiferromagnetic layer is the fcc structure in the vicinity of the interface of the MR layer and the antiferromagnetic layer, and continuously changes to a face-centered-tetragonal (fct) structure toward the surface opposite to the interface.

The foregoing and other objects, features and advantages of the present invention will be apparent from the following detailed description of the invention as illustrated in the accompanying drawings.

DETAILED DESCRIPTION OF THE INVENTION

Figure 7:
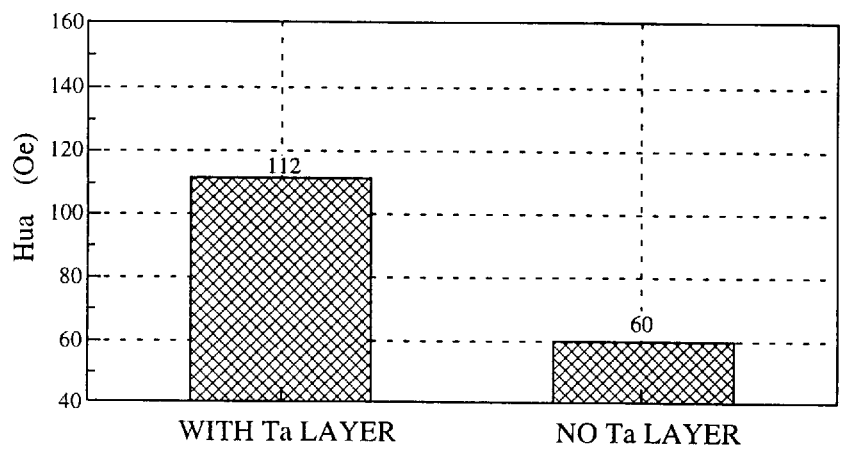
FIG. 7 is a graph for showing the influence of an underlying Ta layer on the Hua of the NiFe/NiMn layers.

From the inventors' study, it has been found that the Hua of the NiFe/NiMn layers can be securely increased by heat treatment when the NiFe layer has an underlying Ta layer. FIG. 7 shows the Hua of the NiFe/NiMn layers with or without the underlying Ta layer after subjected to a heat treatment at about 290° C. for about 6 hours in a nitrogen atmosphere ($Si/SiO_2$(1 μm)/NiFe(30 nm)/NiMn(50 nm)/Mo (10 nm) films and $Si/SiO_2$(1 μm)/Ta(20 nm)/NiFe(30 nm)/NiMn(50 nm)/Mo(10 nm) films). The Hua was measured by a vibrating-sample magnetometer (VSM). As seen from FIG. 7, although the Hua was about 112 Oe in the presence of the underlying Ta layer, about a half thereof (60 Oe) when the NiFe layer had no underlying Ta layer.

Figure 8:
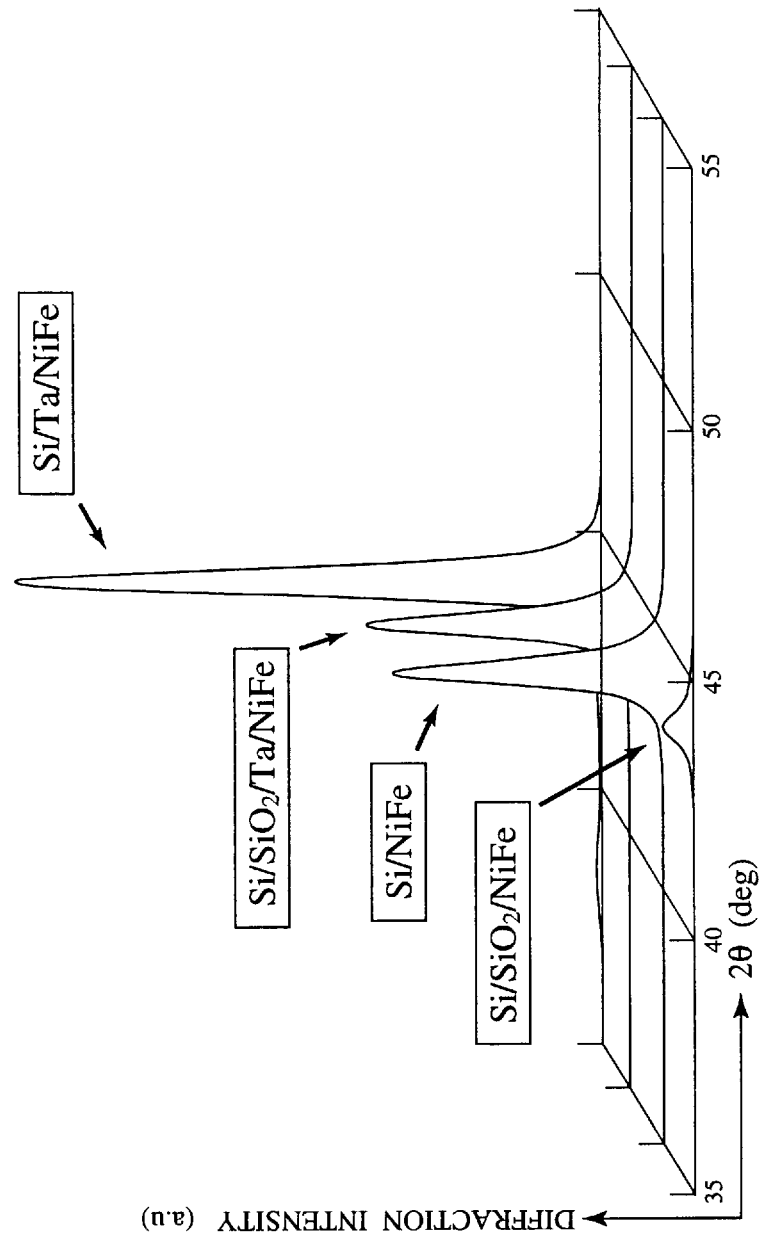
FIG. 8 shows X-ray diffraction patterns of various film layered structures.

To elucidate the reason for the reduction in the Hua in the absence of the underlying Ta layer, a multilayered $Si/SiO_2$(1 μm)/NiFe(30 nm) films and $Si/SiO_2$(1 μm)/Ta(20 nm)/NiFe (30 nm) films were subjected to X-ray diffraction measurement according to 2θ/θ method by using an X-ray diffractometer (manufactured by Rigaku Denki K.K.) equipped with a wide-angle goniometer and a Cu X-ray tube under the conditions of the tube voltage of 50 kV and the tube current of 40 mA. The obtained X-ray diffraction patterns are shown in FIG. 8. As seen from FIG. 8, the $Si/SiO_2$/Ta/NiFe films having the underlying Ta layer showed an X-ray diffraction intensity about 30 times larger than that of the $Si/SiO_2$/NiFe films having no underlying Ta layer. From this result, it is apparent that the orientation degree of (111) plane of the NiFe layer having the fcc structure greatly increases when the NiFe layer has the underlying Ta layer.

The orientation of (111) plane of the NiFe layer is considered to be closely related to the coherency at the interface of NiFe/NiMn layers. When the NiFe layer has a high orientation degree of (111) plane, the deposited NiMn is enhanced to epitaxially grow on the NiFe surface to result in a high exchange coupling of the NiMn layer with the NiFe layer.

It was expected by the inventors that the epitaxial growth could be more promoted and the Hua could be more increased when the orientation degree of NiFe (111) plane was further increased. Since it has been known that the orientation degree can be increased by removing the $SiO_2$ layer on the Si substrate and forming the Ta film or NiFe film directly on the Si substrate, were fabricated the Si/NiFe films and the Si/Ta/NiFe which were subjected to the same X-ray diffraction measurement as above. The diffraction patterns are shown in FIG. 8. As seen from FIG. 8, the diffraction intensity of the $Si/SiO_2$/NiFe films was increased to the same level as that of the $Si/SiO_2$/Ta/NiFe films by eliminating the $SiO_2$ layer. Further, the diffraction intensity of the Si/Ta/NiFe films was two or more times larger than that of the $Si/SiO_2$/Ta/NiFe films.

Figure 14:
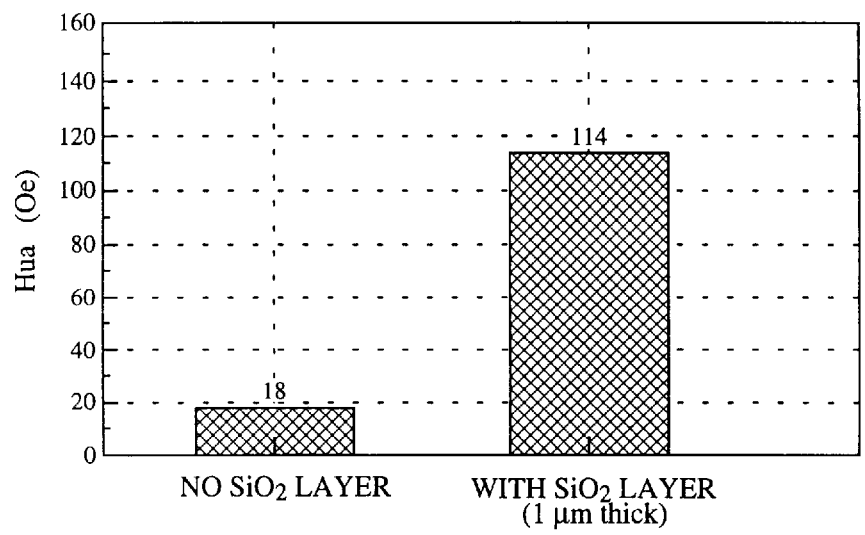
FIG. 14 is a graph showing the influence of the $SiO_2$ layer on the Hua of the NiFe/NiMn layers after heat treatment.
Figure 12:
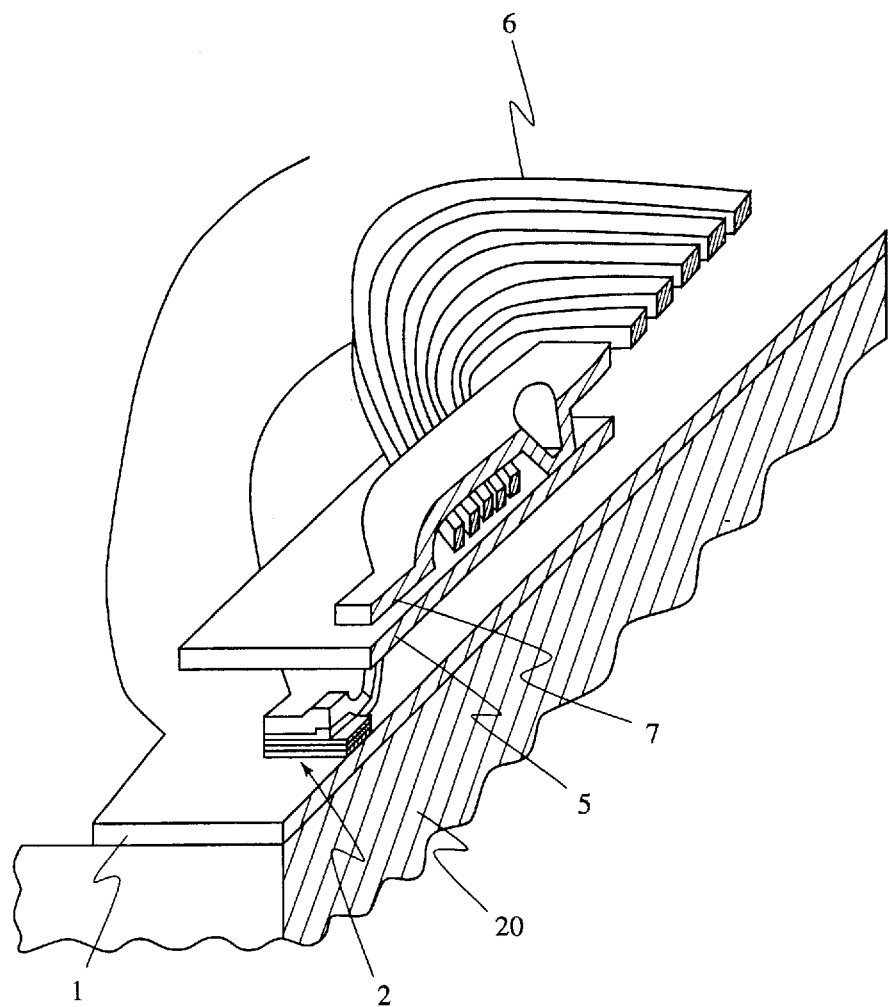
FIG. 12 is a perspective view showing a typical MR head.
Figure 13:
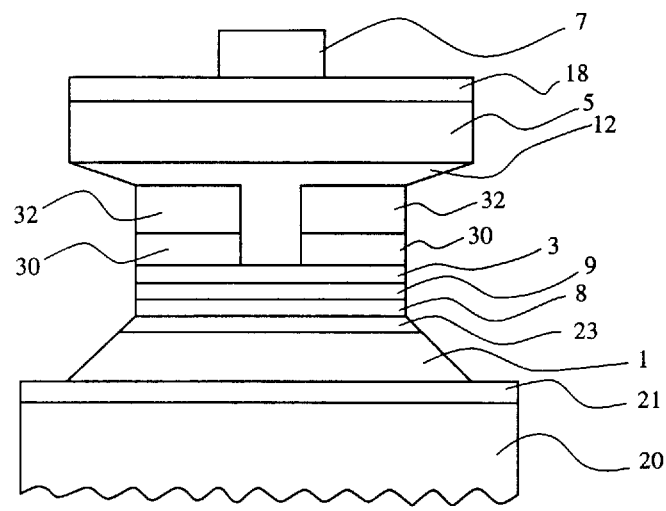
FIG. 13 is a cross-sectional view showing a sensor of a typical MR head.

After heat-treating the multilayered Si/Ta(20 nm)/NiFe (30 nm)/NiMn(50 nm)/Mo(10 nm) films and $Si/SiO_2$(1 μm)/Ta(20 nm)/NiFe(30 nm)/NiMn(50 nm)/Mo(10 nm) films at 290° C. for 6 hours in a nitrogen atmosphere, the Hua of the NiFe/NiMn films was measured by a VSM. The results are shown in FIG. 14. As seen from the results, the Hua was 114 Oe for the $Si/SiO_2$/Ta/NiFe/NiMn/Mo films, whereas the Hua was extremely small, i.e., only 18 Oe for the Si/Ta/NiFe/NiMn/Mo films although it had a remarkably increased orientation degree of NiFe (111) plane.

As described above, as seen from FIG. 7, a high orientation degree of NiFe (111) plane is necessary for achieving a high Hua of the NiFe/NiMn films. However, as seen from FIG. 14, an excessively high orientation degree does not necessarily provide a high Hua.

From more detailed studies on the crystalline structures of the MR layer and the antiferromagnetic layer, the inventors have found that at least two requirements must be met to increase the Hua, namely, (1) an antiferromagnetic layer having the fct structure must be present, and (2) the epitaxial growth must be required at the interface of the NiFe/NiMn films to ensure a good coherency thereof, and the antiferromagnetic layer in the vicinity of the interface should have the fcc structure.

Figure 1:
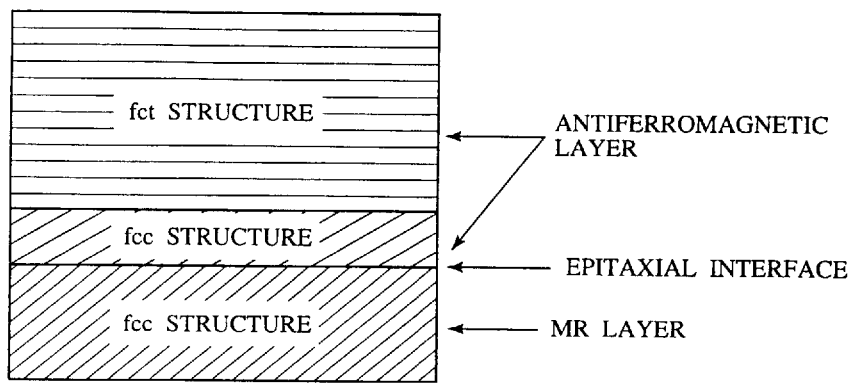
FIG. 1 is a schematic cross-sectional view showing a crystalline structure of the MR sensor of the present invention.

In order to meet both the requirements (1) and (2), the NiMn layer is necessary to have a binary crystalline structure. Such a binary crystalline structure is schematically shown in FIG. 1.

Figure 2:
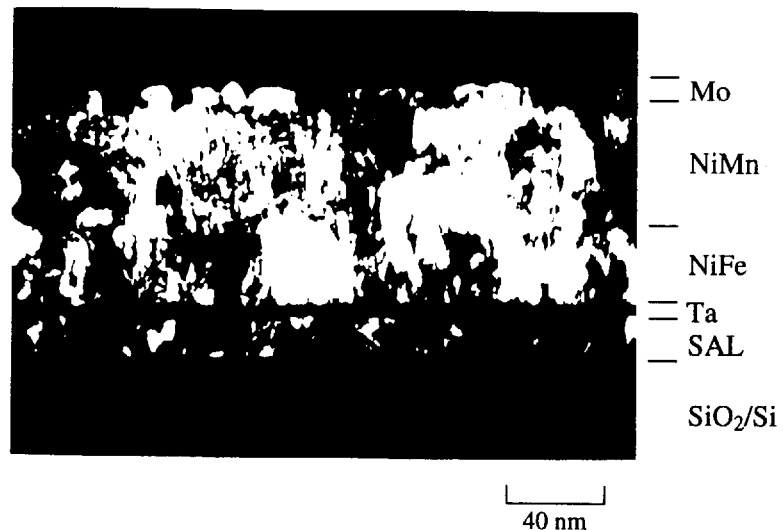
FIG. 2 is a dark-field electron microscopic image showing an epitaxial growth at a interface of NiFe/NiMn layers.

As mentioned above, a high orientation degree of NiFe (111) plane promotes the epitaxial growth of the NiMn layer on the NiFe surface. This was experimentally confirmed by the observation of Si/SiO$_2$(1 µm)/NiFeCr (SAL, 20 nm)/ Ta(5 nm)/NiFe(30 nm)/NiMn(50 nm)/Mo(10 nm) films under a transmission electron microscope (TEM). The result thereof is shown in FIG. 2. As a result of the epitaxial growth, the antiferromagnetic NiMn layer directly contacting with the NiFe layer is expected to have the same fcc structure as the NiFe layer, and the difference in the lattice constant is also expected to become smaller. However, it has been known that an antiferromagnetic bulk NiMn has a face-centered-tetragonal (fct) structure (J. S. Kasper et al.: J. Phys. Chem. Solids Pergamon Press., 11, 231 (1959)). Therefore, an NiMn film creating the Hua is presumed to have the fct structure when considering that an NiMn exhibiting the antiferromagnetism has the fct structure.

Figure 3A:
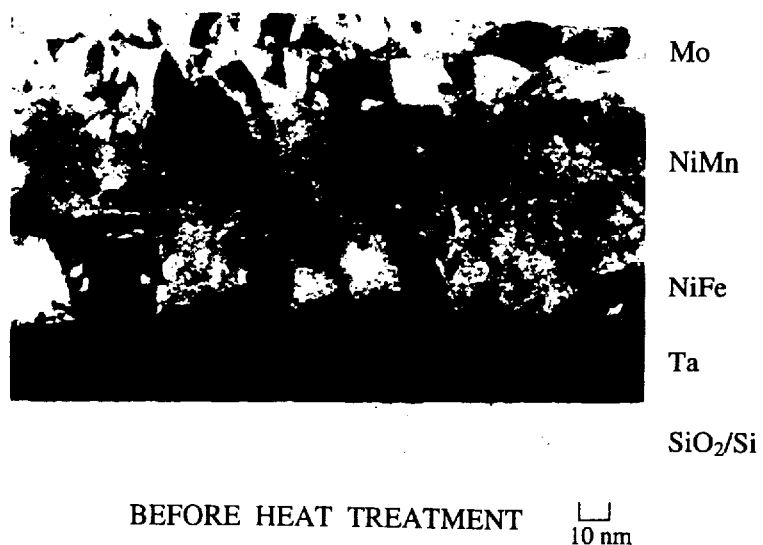
FIG. 3a is a light-field electron microscopic image showing an interface of NiFe/NiMn layers before heat treatment.
Figure 3B:
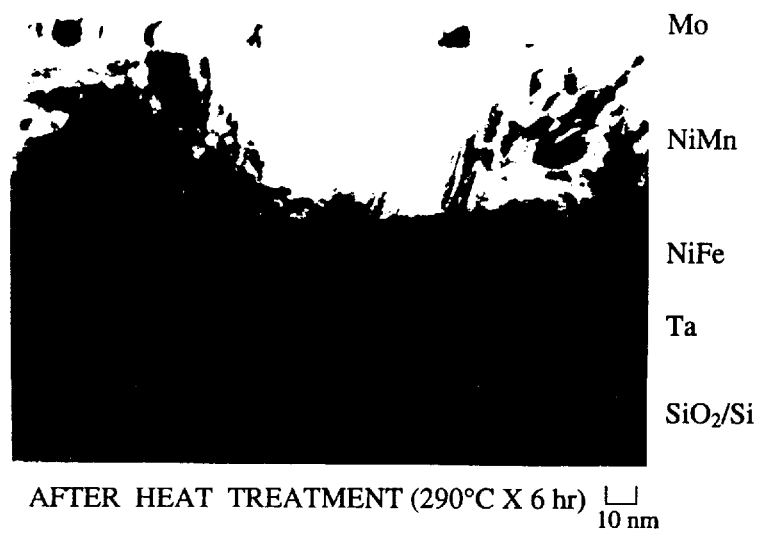
FIG. 3b is a light-field electron microscopic image showing an interface of NiFe/NiMn layers after heat treatment.
Figure 5:
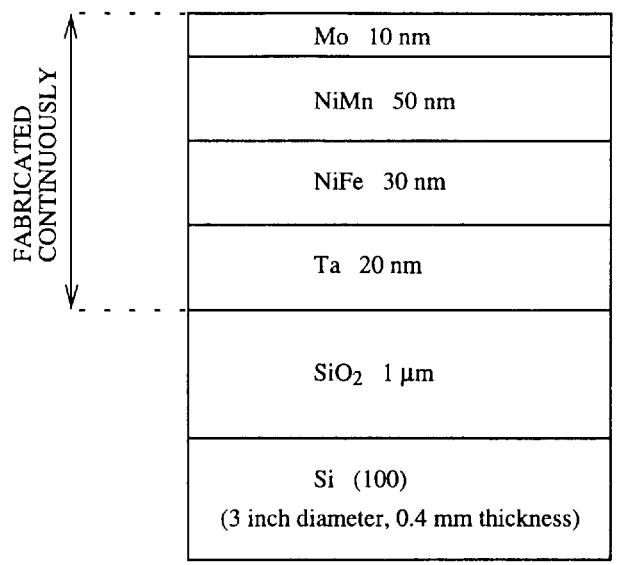
FIG. 5 is a schematic representation showing a cross-section of a film layered structure for the MR sensor of the present invention.

As taught by Tsann Lin et al. discussed above, the as deposited NiFe/NiMn layers create no or only small Hua. This is because the whole portion of the NiMn layer of the as deposited layered structure has the fcc structure like the NiFe layer. Therefore, a part of the fcc structure in the antiferromagnetic NiMn layer is necessary to be changed to the fct structure for creating the Hua in the MR layer. Such a change of the fcc structure to the fct structure can be effected by heat treatment. This can be confirmed by a TEM photographs taken on a thin film layered structure having a construction of FIG. 5 as shown in FIGS. 3a and 3b. The thin film layered structure was prepared by using an RF magnetron sputtering apparatus in a uniform external magnetic field of about 70 Oe to provide the NiFe MR layer with a unidirectional magnetic anisotropy. Each of the targets of 6 inch in diameter was used to continuously deposit in the same chamber multilayered Ta(20 nm)/NiFe(30 nm)/NiMn (50 nm)/Mo(10 nm) films on an Si wafer (3 inch in diameter and 0.4 mm in thickness) of room temperature having an SiO$_2$ layer (1 µm in thickness) under an Ar pressure of 0.2–0.5 Pa. The ultimate pressure before film-forming was 2×10$^{-5}$ Pa or less. The applied power densities were 1.6/ 2.2/1.1/2.2 W/cm$^2$ for the respective layers.

As seen from FIG. 3a, the NiFe/NiMn interface is unclear and considered to be homogeneous before the heat treatment, and after the heat treatment at 290° C. for 6 hours, the interface becomes clear as evidenced by FIG. 3b. This means the change in the crystalline structure occurred. Thus, although the as-deposited NiMn layer has only the fcc structure, the fcc structure is continuously changed to the fct structure by the heat treatment from the portion slightly distant from the NiFe/NiMn interface to the surface opposite to the interface, while retaining the fcc structure in the vicinity of the interface. As a result thereof, the NiMn layer exhibits the antiferromagnetism to create the Hua in the MR layer. Since the crystalline structure of the NiMn layer continuously changes from the fcc structure to the fct structure toward the upper surface opposite to the NiFe/ NiMn interface, there is no clear boundary between the fcc structure and the fct structure.

Figure 4:
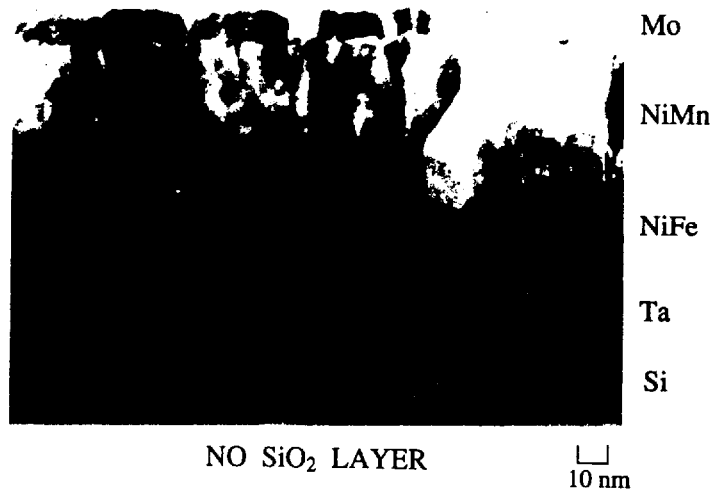
FIG. 4 is a light-field electron microscopic image showing a growth of columnar crystals in substrate/Ta/NiFe/NiMn/Mo layers.
Figure 6:
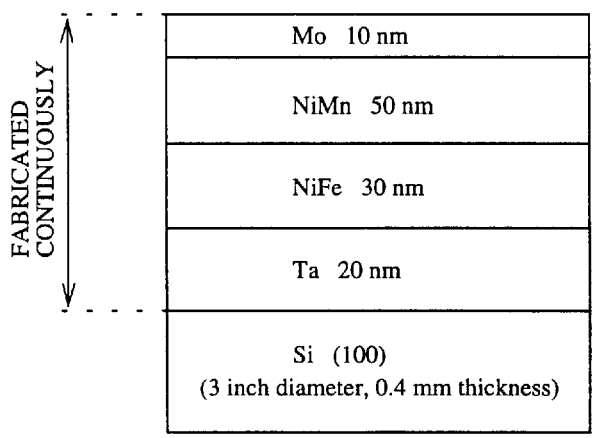
FIG. 6 is a schematic representation showing a cross-section of another film layered structure for comparison.

As noted above, the Hua of the NiFe/NiMn layers is not increase to a sufficient level when the orientation degree of NiFe (111) plane is excessively high. The reason for such a reduction may be that the fcc structure of the NiMn layer remains not changed to the fct structure even after the heat treatment. To confirm this, a thin film layered structure having a construction of FIG. 6 was prepared in the same manner as above except for using an Si wafer having no SiO$_2$ layer as the substrate, and the thin film layered structure was heat-treated at 290° C. for 6 hours. The TEM photograph of the thin film layered structure thus treated is shown in FIG. 4. As seen from FIG. 4, the columnar crystals extend from the NiFe layer to the protective Mo layer through the NiMn layer. Therefore, it may be presumed that the change of the fcc structure to the fct structure is inhibited in spite of the heat treatment when the orientation degree of NiFe (111) plane is excessively high, thereby failing to increase the Hua.

From the above, it is necessary to regulate the orientation degree of NiFe (111) plane within the range which enables the NiMn layer to epitaxially grow on the surface of the NiFe layer, as well as, which does not prevent the NiMn layer from changing from the fcc structure to the fct structure. Namely, it is important for obtaining an Hua of sufficient level for practical use to regulate the X-ray diffraction intensity to the level of the Si/SiO$_2$/Ta/NiFe films, preferably 3000 to 8000 cps.

The MR sensor of the present invention may be produced as follows.

Each of the targets for the corresponding layers such as underlying layer, the ferromagnetic MR layer and the antiferromagnetic layer is continuously sputtered by an RF magnetron sputtering method, for example, to deposit multilayered films on a substrate in a manner known in the art. The material for the MR layer is an NiFe-based alloy, and an NiMn based alloy for the antiferromagnetic layer. The thickness is preferably 5 to 50 nm for the MR layer and 20 to 100 nm for the antiferromagnetic layer. The underlying layer is made of Ta and has a thickness of 3 to 20 nm. The underlying Ta layer may be underlayed by a space layer made of SiO$_2$ or Al$_2$O$_3$ and having a thickness of 0.1 to 1 µm. On the antiferromagnetic layer, a protective lay made of Mo and having a thickness of 3 to 20 nm may be further deposited. A soft adjacent layer (SAL) providing the MR layer with a transverse bias field and having a thickness of 5 to 50 nm may be formed from an Ni-Fe-based alloy such as NiFeCr, NiFeNb, etc. under the space layer, between the underlying layer and the space layer, or between two underlying Ta layers.

The as deposited multilayered films thus prepared is then heat-treated to change a part of the fcc structure in the antiferromagnetic layer to the fct structure at 230°–300° C. for 3–6 hours in nitrogen atmosphere to obtain the MR sensor of the present invention.

Figure 9:
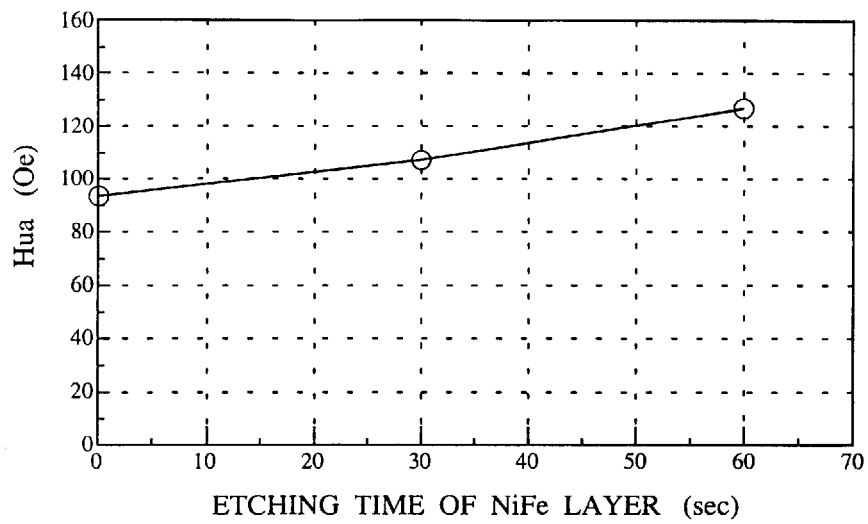
FIG. 9 is a graph showing a correlation of the etching time for treating the NiFe surface and the Hua of the NiFe/NiMn layers.

The cleaning of the surface of the NiFe layer before depositing the NiMn layer has been found to be effective for promoting the epitaxial growth of the NiMn layer. The cleaning may be conducted by etching the surface of NiFe layer, more specifically, by ion etching under an applied power of about 200 W and an Ar gas pressure of about 0.2 Pa. The correlation of the etching time and the Hua of Si/SiO$_2$(1 µm)/Ta(20 nm)/NiFe(30 nm)/NiMn(50 nm)/Mo (10 nm) films is shown in FIG. 9. Since the thickness of the NiFe layer was reduced depending on the etching time, the loss in thickness was made up for by regulating the thickness of the as-deposited NiFe layer so that the NiFe layer after etching treatment had a predetermined thickness. The thickness loss can be also made up for by further depositing NiFe layer on the cleansed surface of the previously deposited NiFe layer. It can be seen from FIG. 9 that the Hua increases with increasing time of etching. Therefore, it is apparent that the cleaning of the surface of the NiFe layer promote the epitaxial growth of the NiMn layer.

Figure 10:
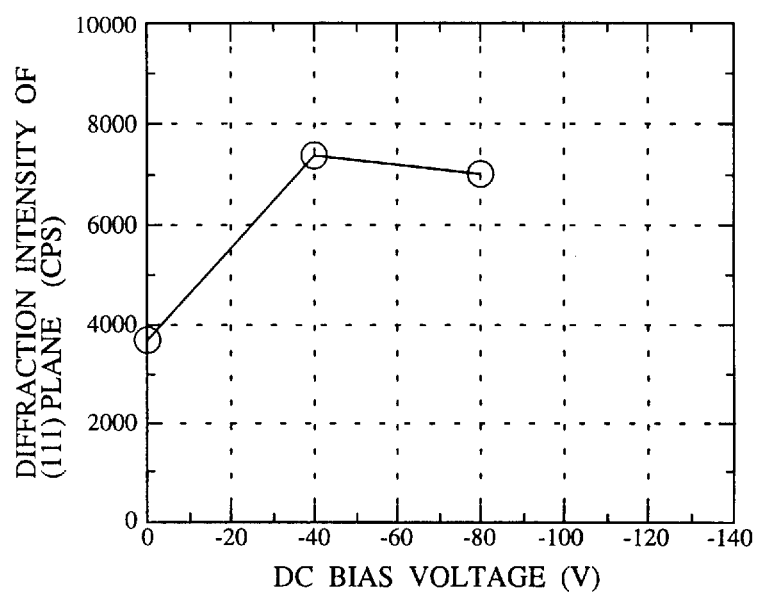
FIG. 10 is a graph showing a correlation of the DC bias voltage applied during NiFe-film fabrication and the diffraction intensity of (111) plane of the NiFe layer.
Figure 11:
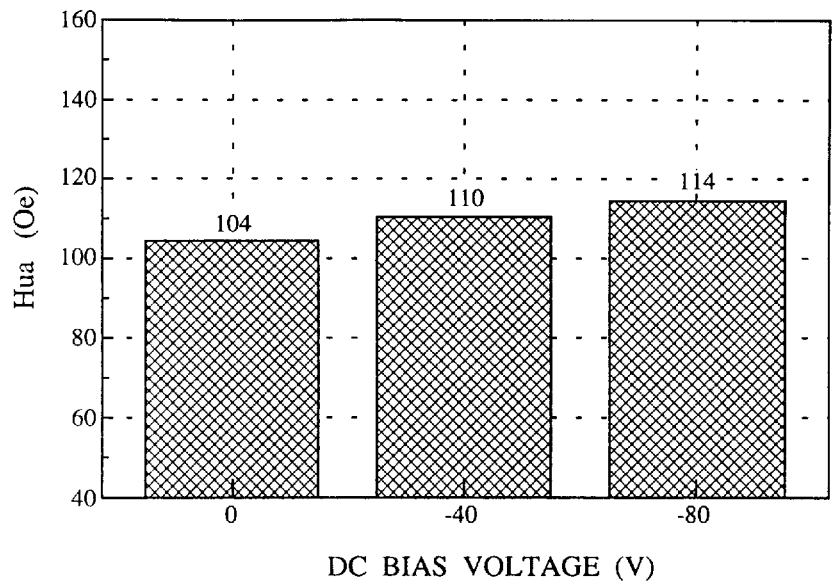
FIG. 11 is a graph showing the dependency of the Hua of the NiFe/NiMn layers on the DC bias voltage applied during NiFe-film fabrication.

Further, it has been found that the sputtering while biasing the substrate improves the characteristics of the deposited films. The correlation between the DC bias voltage applied to the substrate during the NiFe film fabrication and the diffraction intensity of NiFe (111) plane is shown in FIG. 10 ($Si/SiO_2$(1 µm)/Ta(20 nm)/NiFe(30 nm) films). The X-ray diffraction intensity increases, and therefore the orientation degree becomes higher with negatively increasing bias voltage. As shown in FIG. 11, the Hua also increases with negatively increasing bias voltage, and the effect is the most remarkable at −40 V or less.

The MR sensor of the present invention thus produced may be disposed into a space between a bottom shield and a middle shield via insulating layers to obtain an MR head.

By varying the MR stripe structure and the film fabrication method of the MR stripe, tree MR heads (read track width of 3 µm, MR stripe height of 2 µm, read gap length of 0.32 µm and $Al_2O_3$ insulating layer) were fabricated to evaluate the amplitude covariance (COV) of the MR head output. The structure of the MR stripe used in each MR head is shown below.

EXAMPLE 1: $Al_2O_3$/Ta(20 nm)/NiFeCr(20 nm)/Ta(5 nm)/NiFe(30 nm)/NiMn(50 nm)/Mo(10 µm)

EXAMPLE 2: $Al_2O_3$/Ta(20 nm)/NiFeCr(20 nm)/Ta(5 nm)/NiFe(30 nm)/NiMn(50 nm)/Mo(10 µm)

COMPARISON: $Al_2O_3$/NiFeCr(20 nm)/$SiO_2$(5 nm)/NiFe (30 nm)/NiMn(50 nm)/Mo(10 µm)

In Example 1 and Comparison, each layer of the films was continuously deposited. In Example 2, the surface of the as deposited NiFe layer was subjected to etching by reverse sputtering for 60 seconds, and then NiFe was further deposited on the treated NiFe layer until the thickness reached 30 nm. The NiMn layer and Mo layer were continuously deposited on the NiFe layer thus formed.

The COV value is obtained by dividing a standard deviation of the output level after 10000 read/write operations of signals 111 . . . by an average value, and means the amount of scatter in the output. The lower the COV value, the better the MR head characteristics, and a COV value of 2% or less is required in practical use.

Figure 15:
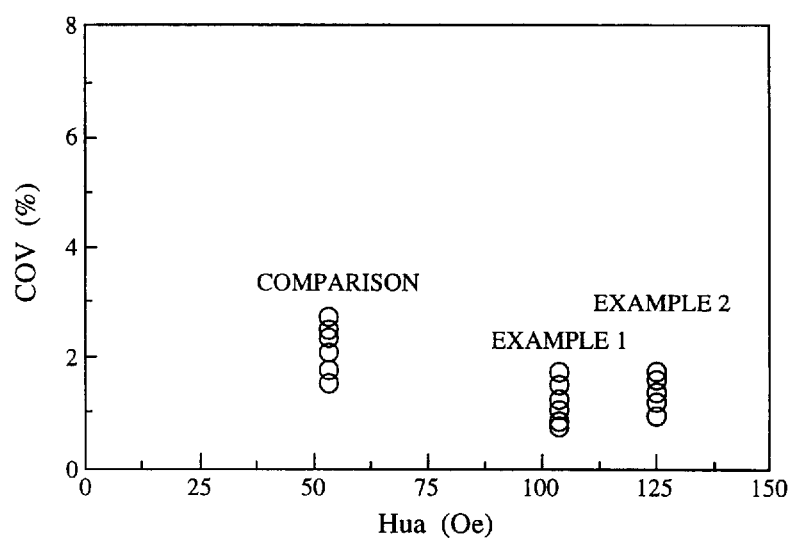
FIG. 15 is a graph showing the COV of MR heads of the present invention and a comparative MR head.

As seen from FIG. 15, the MR head having the MR sensor of the present invention (Examples 1 and 2) showed a small COV, i.e., less than 2%, this indicating that a good stability of the MR head output can be attained by the present invention.

As described above, the performance of a magnetoresistive head having an exchange-coupled antiferromagnetic layer can be greatly improved by the present invention as compared with conventional heads. More specifically, by controlling the crystalline structure of the exchange-coupled antiferromagnetic layer which is in direct contact with the ferromagnetic MR layer, the strength of the exchange coupling field in the MR layer can be increased, for example, 100 Oe or more of the exchange coupling field can be attained by the present invention when the NiFe layer is 30 nm in thickness. As a result of such a high exchange coupling field, Barkhausen noise, which is an inherent problem of a magnetoresistive head, can be suppressed to make it easy to produce an MR head having a good stability of the MR head output.

What is claimed is:

1. A method for producing a magnetoresistive sensor having a magnetoresistive ferromagnetic layer and an antiferromagnetic layer in direct contact with the magnetoresistive ferromagnetic layer, the method comprising:

depositing the magnetoresistive ferromagnetic layer while DC-biasing a substrate to −40 V or below;

cleansing a surface of the magnetoresistive ferromagnetic layer using an etching treatment; and depositing the antiferromagnetic layer on the cleansed surface of the magnetoresistive ferromagnetic layer.

2. The method of claim 1, further comprising:

subjecting the magnetoresistive ferromagnetic layer to a film fabrication process after cleansing using the etching treatment to attain a predetermined thickness of the magnetoresistive ferromagnetic layer.

* * * * *

UNITED STATES PATENT AND TRADEMARK OFFICE
CERTIFICATE OF CORRECTION

PATENT NO. : 5,866,212
DATED : February 2, 1999
INVENTOR(S) : Hisao Kurosawa, et al.

It is certified that error appears in the above-identified patent and that said Letters Patent is hereby corrected as shown below:

Column 2, line 25, change "SIN" to --S/N--.

Signed and Sealed this

Seventeenth Day of August, 1999

Attest:

Q. TODD DICKINSON

Attesting Officer

Acting Commissioner of Patents and Trademarks